(12) United States Patent
Takeda et al.

(10) Patent No.: US 11,652,023 B2
(45) Date of Patent: May 16, 2023

(54) SEMICONDUCTOR DEVICE INCLUDING A SEMICONDUCTOR ELEMENT WITH A GATE ELECTRODE ON ONLY ONE SURFACE

(71) Applicant: HITACHI POWER SEMICONDUCTOR DEVICE, LTD., Hitachi (JP)

(72) Inventors: Naoki Takeda, Tokyo (JP); Tomohiro Onda, Hitachi (JP); Kenya Kawano, Tokyo (JP); Hiroshi Shintani, Tokyo (JP); Yu Harubeppu, Tokyo (JP); Hisashi Tanie, Tokyo (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 200 days.

(21) Appl. No.: 17/078,931

(22) Filed: Oct. 23, 2020

(65) Prior Publication Data

US 2021/0143081 A1 May 13, 2021

(30) Foreign Application Priority Data

Nov. 11, 2019 (JP) .............................. JP2019-203742

(51) Int. Cl.
*H01L 23/373* (2006.01)
*H01L 23/495* (2006.01)
(Continued)

(52) U.S. Cl.
CPC ........ *H01L 23/3736* (2013.01); *H01L 23/492* (2013.01); *H01L 23/49513* (2013.01); *H01L 23/49562* (2013.01); *H01L 23/49838* (2013.01)

(58) Field of Classification Search
CPC ............. H01L 23/3736; H01L 23/3107; H01L 23/3135; H01L 24/83; H01L 23/562;
(Continued)

(56) References Cited

U.S. PATENT DOCUMENTS

2015/0054166 A1  2/2015  Beer et al.

FOREIGN PATENT DOCUMENTS

JP   2004-289028 A   10/2004
JP   2005-353945 A   12/2005
(Continued)

OTHER PUBLICATIONS

JP 2009111187 (Year: 2009).*
(Continued)

*Primary Examiner* — Patricia D Valenzuela
(74) *Attorney, Agent, or Firm* — Crowell & Moring LLP (57) ABSTRACT

Provided is a highly reliable semiconductor device capable of reducing stress generated in a semiconductor element even when a highly elastic joining material such as a Pb-free material is used in a power semiconductor having a double-sided mounting structure. The semiconductor device includes a semiconductor element including a gate electrode only on one surface, an upper electrode connected to the surface of the semiconductor element on which the gate electrode is provided, and a lower electrode connected to a surface opposite to the surface of the semiconductor element on which the gate electrode is provided. A connection end portion of the upper electrode with the surface of the semiconductor element on which the gate electrode is provided is located inside an end portion of the surface of the semiconductor element on which the gate electrode is provided, and a connection end portion of the lower electrode with the opposite surface of the semiconductor element is located inside an end portion of the opposite surface of the semiconductor element.

14 Claims, 8 Drawing Sheets

(51) Int. Cl.
*H01L 23/492* (2006.01)
*H01L 23/498* (2006.01)

(58) Field of Classification Search
CPC .............. H01L 24/48; H01L 2224/01; H01L
2224/0603; H01L 2224/06181; H01L
2224/29111; H01L 2224/32014; H01L
2224/32245; H01L 2224/83447; H01L
2224/83801; H01L 2224/8384; H01L
2224/8385; H01L 2924/10161; H01L
2924/10329; H01L 2924/3512; H01L
24/33; H01L 24/01; H01L 2224/33181;
H01L 2224/48091; H01L 2224/73265;
H01L 2924/00014; H01L 2924/10253;
H01L 2924/1203; H01L 2924/1301;
H01L 2924/13055; H01L 2924/13091;
H01L 23/482; H01L 23/4827; H01L
23/485; H01L 25/16; H01L 29/78; H01L
29/861; H01L 23/49838; H01L 23/49866;
H01L 24/06; H01L 24/09; H01L 29/7395;
H01L 29/7802; H01L 23/492
See application file for complete search history.

(56) References Cited

FOREIGN PATENT DOCUMENTS

| JP | 2009-111187 A | 5/2009 |
| JP | 2013-149760 A | 8/2013 |
| JP | 2013-187494 A | 9/2013 |

OTHER PUBLICATIONS

JP 2013187494 (Year: 2013).*
Extended European Search Report issued in European Application No. 20199996.8 dated May 3, 2021 (12 pages).
Das Europaeische Parlament Und Der Rat Der Europaeischen Union: "Richtlinie 2002/95/EG Des Europaeischen Parlaments Und Des Rates vol. 27. Jan. 2003 zur Beschraenkung der Verwendung bestimmter gefaehrlicher Stoffe in Elektro- und Elektronikgeraeten," Amtsblatt Der Europaeischen Union, Jan. 27, 2003, pp. L37/19-L37/23, vol. L37, XP-002558112 (five (5) pages).
Korean-language Office Action issued in Korean Application No. 10-2020-0145742 dated Mar. 1, 2022 with English translation (14 pages).

* cited by examiner

TOP VIEW

FIG. 10

CROSS-SECTIONAL VIEW TAKEN ALONG LINE B-B'

FIG. 11

CROSS-SECTIONAL VIEW TAKEN ALONG LINE C-C'

SEMICONDUCTOR DEVICE INCLUDING A SEMICONDUCTOR ELEMENT WITH A GATE ELECTRODE ON ONLY ONE SURFACE

CLAIM OF PRIORITY

The present application claims priority from Japanese Patent application serial no. 2019-203742, filed on Nov. 11, 2019, the content of which is hereby incorporated by reference into this application.

BACKGROUND OF THE INVENTION

1. Field of the Invention

The present invention relates to a structure of a semiconductor device, and particularly to an effective technique applied to a mounting structure of a power semiconductor for power control.

2. Description of the Related Art

With spread of power semiconductors worldwide, mounting techniques have been developed for semiconductor devices used in switching circuits and rectifier circuits to meet various requirements such as a large current, high heat dissipation, and high reliability.

An example of the mounting techniques of power semiconductors includes a double-sided mounting structure in which electrodes are provided on upper and lower surfaces of a semiconductor element and at least one electrode on both the upper and lower surfaces is connected to an external electrode.

Examples of the electrodes on the upper and lower surfaces of the semiconductor element include configurations such as a metal oxide semiconductor field effect transistor (MOSFET) including a source electrode and a gate electrode on one surface and a drain electrode on the other surface, an insulated gate bipolar transistor (IGB) including an emitter electrode and a gate electrode on one surface and a collector electrode on the other surface, and a diode including a P pole on one surface and an N pole on the other surface.

A power semiconductor element usually includes an outer peripheral portion insulating layer generally formed by a silicon oxide film ($SiO_2$) on an outer peripheral portion of either of its surfaces. In the above-mentioned examples, the outer peripheral portion insulating layer is formed on the source electrode side in the MOSFET, the emitter electrode side in the IGBT, and either the P pole side or the N pole side in the diode.

An example of a semiconductor device having this double-sided mounting structure includes a semiconductor device of JP-A-2013-187494 (Patent Literature 1). In Patent Literature 1, a lead frame 5 and abase electrode 3 are connected to upper and lower surfaces of a semiconductor element 1 via solders 2 and 4, respectively. The semiconductor element 1 has recessed cutouts at end portions excluding an uppermost portion and a lowermost portion thereof. The solders 2 and 4 are not connected to the end portions of the semiconductor element 1. However, the solders 2 and 4 are connected in the vicinity of the end portions of the semiconductor element 1 while avoiding the end portions of the semiconductor element 1. An end portion of the lead frame 5 is connected inside the end portions of the semiconductor element 1, and an end portion of the base electrode 3 is connected outside the end portions of the semiconductor element 1. Apart or all of the lead frame 5, the solders 2 and 4, the base electrode 3, and the semiconductor element 1 are sealed with a sealing resin 6.

In JP-A-2004-289028 (Patent Literature 2), a metal plate 6a having electrical connection with a lead frame 1 and a case electrode 5 is connected to upper and lower surfaces of a semiconductor element 3 via a joining member 2. An end portion of the lead frame 1 is connected inside an end portion of the semiconductor element 3, and an end portion of a surface of the metal plate 6a which is connected to the joining member is connected to be flush with the end portion of the semiconductor element 3. A part or all of the lead frame 1, the joining member 2, the metal plate 6a, and the semiconductor element 3 are sealed with an insulating member 4.

In JP-A-2013-149760 (Patent Literature 3), metal layers 4a, 4b, 14a, and 14b are connected to both surfaces of a semiconductor element 6 via solder layers 5a, 5b, 15a, and 15b. End portions of all of the solder layers 5a, 5b, 15a, and 15b are connected inside the semiconductor element 6. An end portion of a surface of each of the metal layers 4a, 4b, 14a, and 14b which is connected to the semiconductor element 6 is connected inside an end portion of the semiconductor element 6. In this semiconductor device, the semiconductor element 6 includes gate electrodes (control electrodes) on both sides.

However, in recent years, a lead (Pb)-containing solder often used as a joining material for a semiconductor device has been restricted in consideration of the environment. Since Pb has a low melting point and low elasticity, it has an advantage that it is easy to handle as the joining material for the semiconductor device. However, a Pb-free material is being developed in place of the Pb-containing solder because Pb is harmful to human bodies.

Examples of the Pb-free material generally include a solder containing no Pb such as Sn—Sb or Sn—Ag—Cu, or a joining material that uses Cu or Ag and is sintered at a high temperature. These joining materials have higher elasticity than the lead-containing solder, and stress of a semiconductor element increases due to a heat load at a time of connection; in a worst case, defects such as cracking occur.

In particular, in the double-sided mounting structure often used in the power semiconductor, it is necessary to make a connection area as wide as possible in order to flow a large current, which is a major problem for implementing high reliability.

In the above-mentioned Patent Literature 1, the lead frame 5 is shorter than the semiconductor element 1 and the base electrode 3 is longer than the semiconductor element 1. Therefore, when the semiconductor element 1 and the base electrode 3, and the semiconductor element 1 and the lead frame 5 are connected using, for example, the Pb-free material, bending deformation may occur due to a difference in thermal expansion coefficients between them, and stress of the semiconductor element 1 may increase due to the Pb-free material having high elasticity. Therefore, there is a problem that a risk of the semiconductor element 1 cracking increases.

In the above-mentioned Patent Literature 2, the lead frame 1 is shorter than the semiconductor element 3, and the metal plate 6a has the same length as the semiconductor element 3. Therefore, when the semiconductor element 3 and the lead frame 1, and the semiconductor element 1 and the metal plate 6a are connected using, for example, the Pb-free material, bending deformation may occur due to a difference in thermal expansion coefficients between them, and stress of the semiconductor element 3 may increase due to the Pb-free material having high elasticity. Therefore, similar to Patent Literature 1, there is a problem that a risk of the semiconductor element 3 cracking increases.

Further, in the above-mentioned Patent Literature 3, the gate electrodes (control electrodes) are provided on both sides of the semiconductor element 6, the semiconductor element 6 and the metal layers 4a, 4b, 14a, and 14b are partially connected to each other, and the semiconductor device has a symmetrical structure relative to the semiconductor element 6. Therefore, it cannot be said that a semiconductor element such as the MOSFET having the source electrode and the gate electrode on one surface and the drain electrode on the other surface is suitable for a semiconductor device that flows a large current.

SUMMARY OF THE INVENTION

Therefore, an object of the invention is to provide a highly reliable semiconductor device capable of reducing stress generated in a semiconductor element even when a highly elastic joining material such as a Pb-free material is used in a power semiconductor having a double-sided mounting structure.

Another object of the invention is to provide a semiconductor device capable of handling a large current with high heat dissipation while implementing high reliability in a power semiconductor having a double-sided mounting structure.

In order to solve the above-mentioned technical problem, the invention provides a semiconductor device including a semiconductor element including a gate electrode only on one surface, an upper electrode connected to the surface of the semiconductor element on which the gate electrode is provided, and a lower electrode connected to a surface opposite to the surface of the semiconductor element on which the gate electrode is provided. A connection end portion of the upper electrode with the surface of the semiconductor element on which the gate electrode is provided is located inside an end portion of the surface of the semiconductor element on which the gate electrode is provided, and a connection end portion of the lower electrode with the opposite surface of the semiconductor element is located inside an end portion of the opposite surface of the semiconductor element.

Further, the invention provides a semiconductor device including a semiconductor element including an outer peripheral portion insulating layer on a chip outer peripheral portion only on one surface, an upper electrode connected to the surface of the semiconductor element on which the outer peripheral portion insulating layer is provided, and an lower electrode connected to a surface opposite to the surface of the semiconductor element on which the outer peripheral portion insulating layer is provided. The semiconductor element is a diode, and a connection end portion of the upper electrode with the surface of the semiconductor element on which the outer peripheral portion insulating layer is provided is located inside an end portion of the surface of the semiconductor element on which the outer peripheral portion insulating layer is provided, and a connection end portion of the lower electrode with the opposite surface of the semiconductor element is located inside an end portion of the opposite surface of the semiconductor element.

According to the invention, a highly reliable semiconductor device capable of reducing stress generated in a semiconductor element even when a highly elastic joining material such as a Pb-free material is used in a power semiconductor having a double-sided mounting structure can be implemented.

Further, a semiconductor device capable of handling a large current with high heat dissipation while implementing high reliability in a power semiconductor having a double-sided mounting structure can be implemented.

Technical problems, configurations and effects other than those described above will be clarified by description of the following embodiments.

DESCRIPTION OF THE PREFERRED EMBODIMENTS

Hereinafter, embodiments of the invention will be described with reference to the drawings. In the drawings, the same configurations are denoted by the same reference numerals, and a detailed description of repeated parts will be omitted.

First Embodiment

Figure 2:
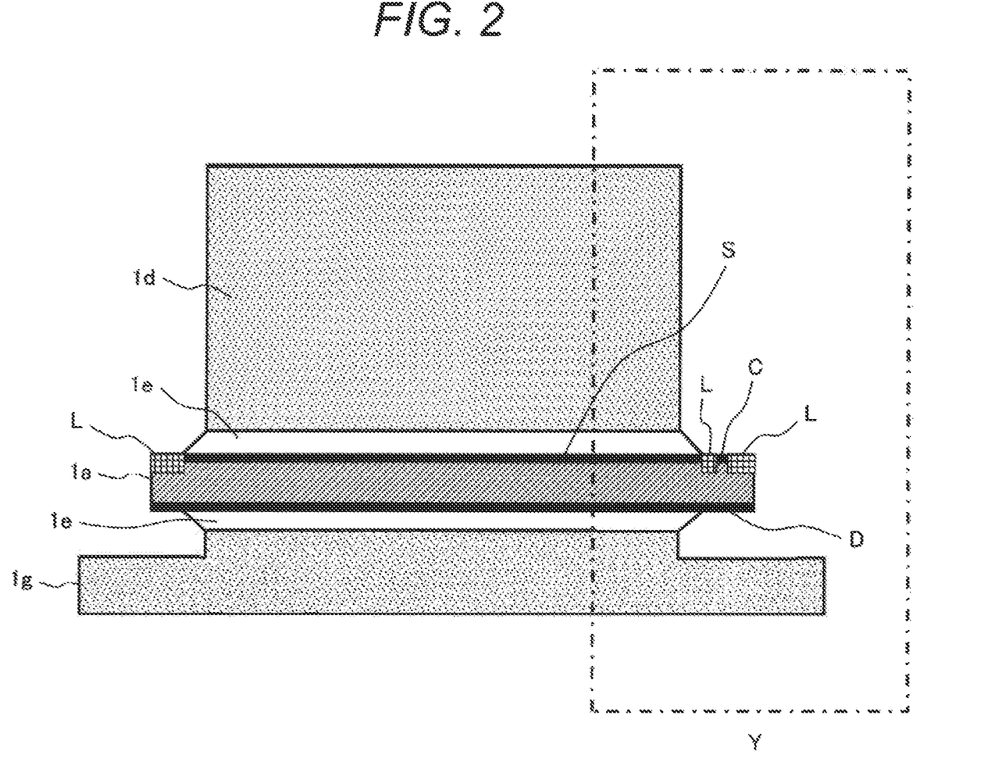
FIG. 2 is a diagram schematically showing a vertical structure in the vicinity of a semiconductor element 1a in FIG. 1.
Figure 3:
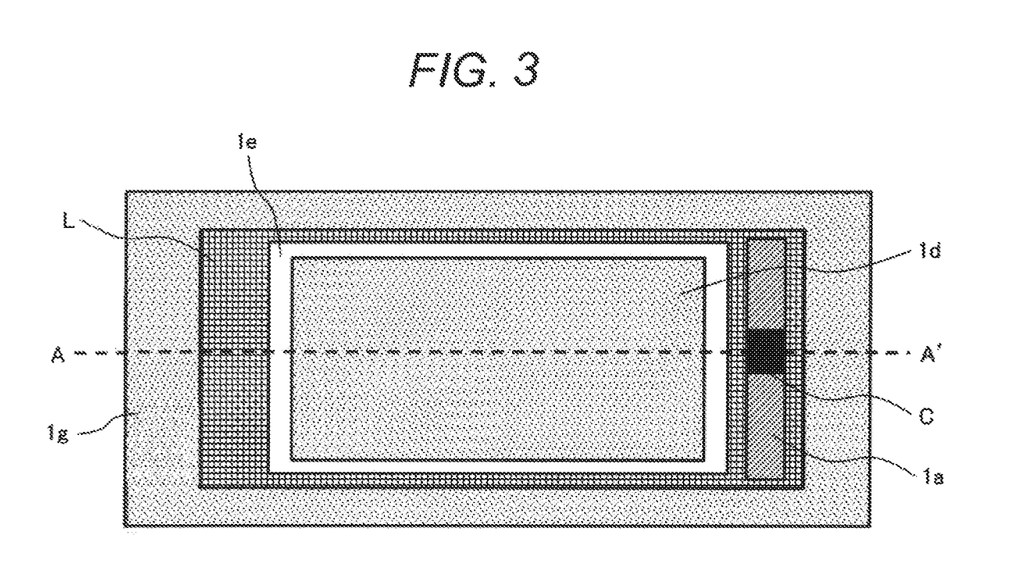
FIG. 3 is a diagram schematically showing a planar structure in the vicinity of the semiconductor element 1a in FIG. 1.
Figure 4:
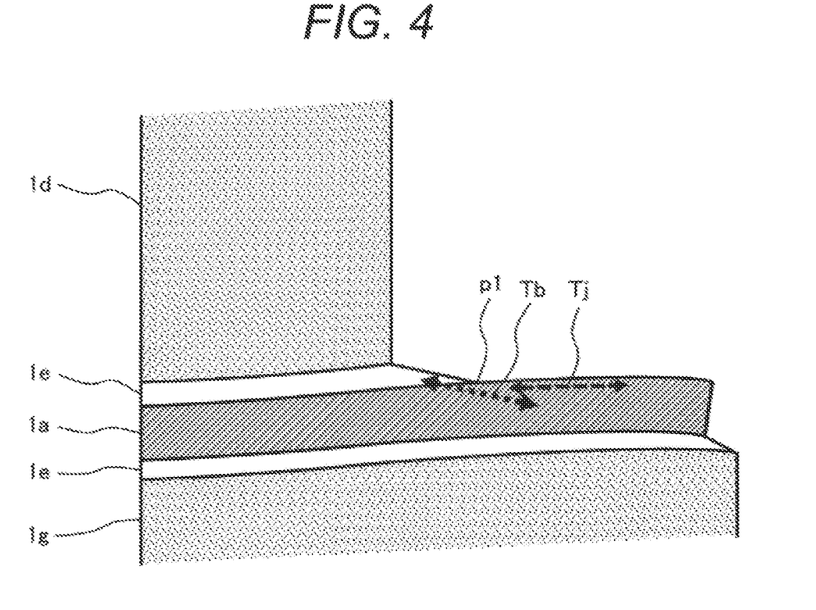
FIG. 4 is a diagram schematically showing deformation in the vicinity of an end portion of a semiconductor element in a connecting process of a semiconductor device in the related art.
Figure 12:
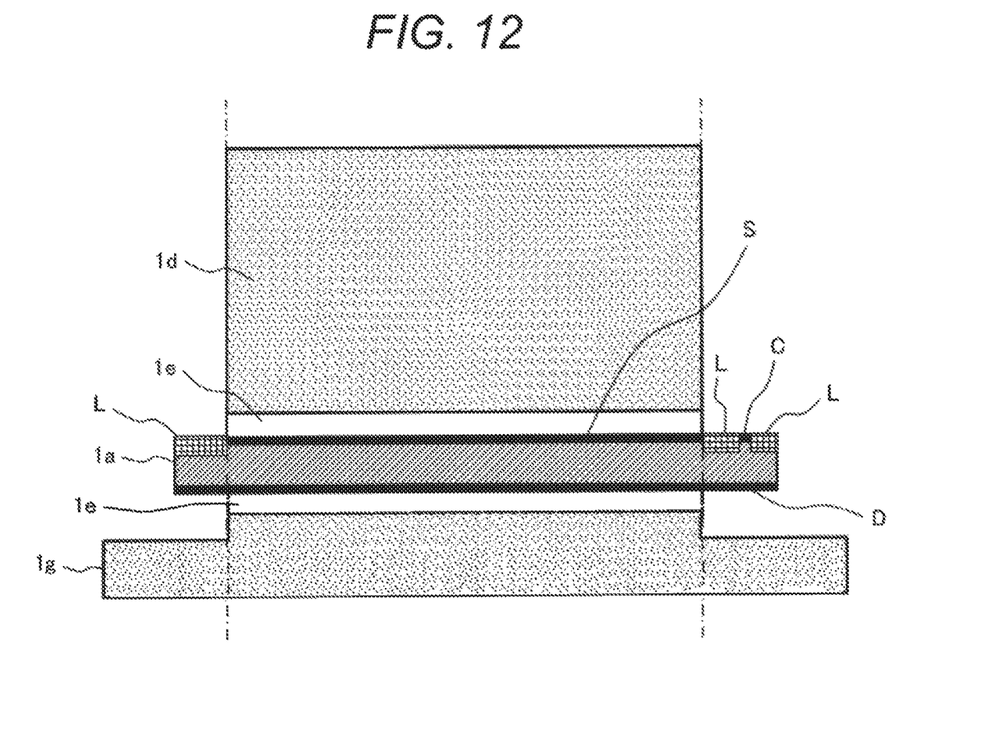
FIG. 12 is a diagram showing a modification of the first embodiment (FIG. 2).

A semiconductor device according to a first embodiment of the invention will be described with reference to FIGS. 1 to 7 and 12. It should be noted that FIG. 4 is a diagram schematically showing deformation in the vicinity of an end portion of a semiconductor element in a connecting process of a semiconductor device in the related art shown as a comparative example in order to make functions and effects of the invention shown in FIG. 5 easy to understand. Further, FIG. 12 is a diagram showing a modification of FIG. 2.

<Semiconductor Device 200: Part 1>

Figure 1:
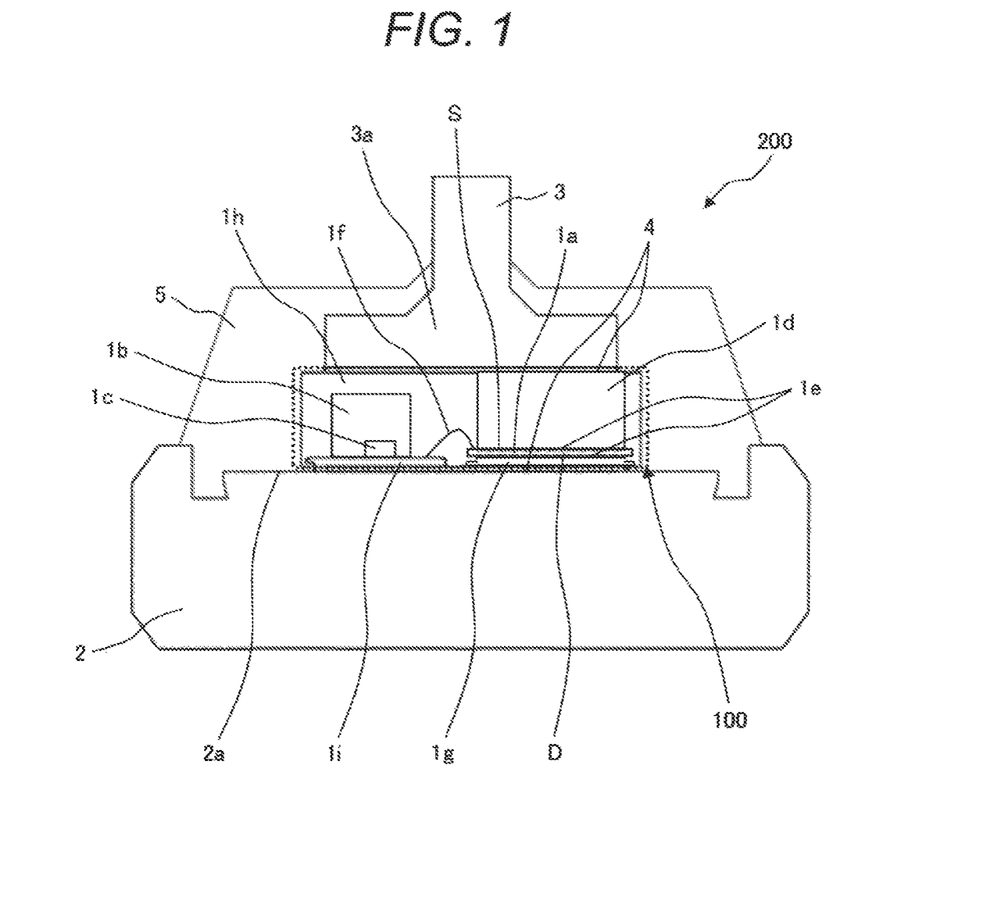
FIG. 1 is a cross-sectional view showing a schematic configuration of a semiconductor device according to a first embodiment of the invention.

First, a structure and a function of the semiconductor device according to the present embodiment will be described with reference to FIG. 1. FIG. 1 is a diagram schematically showing a cross section of a vertical structure of a semiconductor device (rectifying element) 200 for an on-vehicle AC generator (alternator) according to the present embodiment.

In FIG. 1, the semiconductor device 200 includes, as main configurations, a base (first external electrode, first external terminal) 2 including a pedestal (first electrode surface portion) 2a in an upper portion (upper side of a paper surface of FIG. 1), a lead (second external electrode, second external terminal) 3 including a lead header (second electrode surface portion) 3a in a lower portion (lower side of the paper surface of FIG. 1), and an electronic circuit body 100.

The pedestal 2a is connected to a lower electrode (first internal electrode) 1g of the electronic circuit body 100 to be described later via a second conductive joining material (joining material of semiconductor device) 4.

The lead header 3a is connected to an upper electrode (second internal electrode) 1d of the electronic circuit body 100 to be described later via the second conductive joining material 4.

A part located on the pedestal 2a and the upper portion of the base 2, a part located on the lead header 3a and the lower portion of the lead 3, and the electronic circuit body 100 are covered and sealed with a mold resin (second resin, resin of semiconductor device) 5.

The base 2 and the lead 3 serve as external terminals when electrically connected to an external circuit (alternator circuit). The above content is an outline of the configuration of the semiconductor device 200.

<Electronic Circuit Body 100>

Next, a detailed configuration of the electronic circuit body 100 provided in the semiconductor device 200 will be described. In FIG. 1, the electronic circuit body 100 is shown by a broken line to indicate a region occupied by the electronic circuit body 100.

The electronic circuit body 100 includes a semiconductor element 1a, a capacitor 1b, and a control circuit chip 1c. The electronic circuit body 100 further includes the lower electrode 1g, the upper electrode 1d, and a lead frame (support) 1i.

The semiconductor element 1a is formed by, for example, a MOSFET. Further, a drain electrode D (first main terminal) and a source electrode S (second main terminal) of the MOSFET are provided on respective main surfaces of the semiconductor element 1a. Hereafter, the surface of the semiconductor element 1a on which the drain electrode D is provided is indicated as a first main surface of the semiconductor element 1a, and the surface on which the source electrode S is provided is indicated as a second main surface of the semiconductor element 1a.

The drain electrode D is connected to a surface of one end (first surface) of the lower electrode 1g which is the first internal electrode via a first conductive joining material (joining material of electronic circuit body) 1e. The drain electrode D may be connected by ultrasonic joining and the like instead of the first conductive joining material 1e.

The source electrode S is connected to a surface of one end (first surface) of the upper electrode 1d which is the second internal electrode via the first conductive joining material 1e.

The control circuit chip 1c is connected to the lead frame 1i which is the support via the first conductive joining material 1e.

The capacitor 1b that supplies power to the control circuit chip 1c is also connected to the lead frame 1i via the first conductive joining material 1e. An example of the capacitor 1b includes a ceramic capacitor.

As described later, a surface of the other end (second surface) of the lower electrode 1g is exposed from a first surface of the electronic circuit body 100, and is in contact with the pedestal 2a via the second conductive joining material 4.

As described later, a surface of the other end (second surface) of the upper electrode 1d is exposed from a second surface of the electronic circuit body 100, and is in contact with the lead header 3a via the second conductive joining material 4.

The lead frame 1i is electrically insulated from the base 2, that is, the pedestal 2a.

Materials of the first conductive joining material 1e and the second conductive joining material 4 are, for example, a solder which is a general conductive joining material, a metal containing Au, Ag or Cu, or a conductive adhesive material. Examples of the solder include a general high-lead solder, a eutectic solder, a lead-free solder, and the like. An example of the conductive adhesive material includes a material in which a metal filler such as Ag, Cu, and Ni is contained in a resin or only a metal is used.

The materials of the first conductive joining material 1e and the second conductive joining material 4 may be the same or different. Further, the first conductive joining material 1e may be the same material or different materials above and below the semiconductor element 1a. Further, the material of the second conductive joining material 4 may be the same or different above and below the electronic circuit body 100.

As materials of the base 2, the lead 3, the lower electrode 1g, the upper electrode 1d, and the lead frame 1i, Cu which has high thermal conductivity and good conductivity is mainly used, and CuMo, 42 alloy, Al, Au, Ag, and the like are also used. At this time, it is desirable to plate Au, Pd, Ag, Ni, and the like on a connection portion with the conductive joining material in order to improve connection stability.

The control circuit chip 1c is electrically connected to the semiconductor element 1a via a wire 1f. For example, when the semiconductor element 1a is a power MOSFET, the gate electrode formed on the semiconductor element 1a and the control circuit chip 1c are connected by the wire 1f, and the control circuit chip 1c controls a gate voltage of the power MOSFET. Accordingly, a large current can flow through the semiconductor element 1a having a switching function.

The capacitor 1b is electrically connected to the semiconductor element 1a and the control circuit chip 1c by the lead frame 1i and the wire 1f.

The semiconductor element 1a has a function of switching a large current. For example, the semiconductor element (switching circuit chip) 1a having the switching function is a semiconductor element including an IGBT, a gate turn-off thyristor (GTO), and a power MOSFET. The semiconductor element 1a can also be a semiconductor element made of Si, SiC, SiN, GaAs, and the like in which a semiconductor element such as a thyristor for controlling on and off of a large current is formed.

The control circuit chip 1c is a semiconductor element that controls the semiconductor element 1a that switches a large current. The control circuit chip 1c itself is a semiconductor element that does not include the semiconductor element that switches a large current. That is, the control circuit chip 1c is a semiconductor element including a plurality of logic circuits, analog circuits, driver circuits, and the like, and a microprocessor and the like is provided as necessary. The function of controlling a large current flowing into the semiconductor element 1a may be included together.

Further, the semiconductor element 1a, the control circuit chip 1c, the capacitor 1b, the lower electrode 1g, the upper electrode 1d, and the first conductive joining material 1e are integrally covered and sealed by a mold resin (first resin, resin of electronic circuit body) 1h, so that the integrated electronic circuit body 100 is formed.

Hereafter, a side of the electronic circuit body 100 where the lower electrode 1g and the lead frame 1i are disposed is indicated as the first surface, an opposite side, that is, a surface on a side where the upper electrode 1d is disposed is indicated as the second surface. Lower surface sides of the lower electrode 1g and the lead frame 1i and an upper surface side of the upper electrode 1d are exposed to the surface of the electronic circuit body 100 without being covered with the first resin 1h of the electronic circuit body 100.

Therefore, the upper surface of the upper electrode 1d of the electronic circuit body 100 can be electrically connected to the lead header 3a via the second conductive joining material 4.

Therefore, the lower surface of the lower electrode 1g of the electronic circuit body 100 can be electrically connected to the pedestal 2a via the second conductive joining material 4.

<Semiconductor Device 200: Part 2>

As described above, the electronic circuit body 100 is sealed with the first resin 1h and formed integrally, and one surface of each of the lower electrode 1g and the upper electrode 1d is exposed on the surface of the electronic circuit body 100. The exposed surface of the lower electrode 1g is electrically connected to the pedestal 2a of the base 2 by the second conductive bonding material 4, and the surface of the upper electrode 1d is electrically connected to the lead header 3a of the lead 3 by the second conductive bonding material 4, so as to form the semiconductor device 200.

In this configuration, the upper electrode 1d connected to the source electrode S of the semiconductor element 1a is set to be thicker than the lower electrode 1g. Here, to be thicker means to be longer in a direction from the pedestal 2a to the lead header 3a.

By setting the upper electrode 1d to be thicker than the lower electrode 1g in this way, heat generated due to loss when a current flows through the source electrode S can be efficiently dissipated to the upper electrode 1d side, and it is possible to improve cooling performance of the semiconductor device 200.

In the semiconductor element 1a, since a transistor element is mainly formed on the surface on the side where the source electrode S is formed, heat generated by the transistor element mainly occurs on the side where the source electrode S is formed. Therefore, it is more effective to dissipate the heat by the upper electrode 1d. In order to dissipate the heat by the upper electrode 1d, it is effective to increase a heat capacity of the upper electrode 1d and improve heat conduction, and the method of setting the upper electrode 1d to be thicker than the lower electrode 1g as described above is used.

Further, by setting the upper electrode 1d to be thicker, it is possible for the upper electrode 1d to expose a conductor on the lead header 3a side of the electronic circuit body 100, and the upper electrode 1d can be connected to the lead header 3a, that is, the lead 3.

Next, details of the structure of the semiconductor device according to the present embodiment will be described with reference to FIGS. 2 and 3. FIG. 2 is a diagram schematically showing a vertical structure in the vicinity of the semiconductor element 1a in FIG. 1. FIG. 3 is a diagram schematically showing a planar structure in the vicinity of the semiconductor element 1a in FIG. 1. FIG. 2 corresponds to a cross section taken along a line A-A' of FIG. 3. In FIGS. 2 and 3, for easy understanding, only the semiconductor element 1a, the upper electrode 1d, the lower electrode 1g, and the first conductive joining material 1e which are disposed in the semiconductor device 200 are shown.

In FIGS. 2 and 3, the semiconductor element 1a includes agate electrode (control electrode) C and the source electrode S on the upper electrode 1d side, and includes only the drain electrode D on the lower electrode 1g side. Further, the semiconductor element 1a includes an outer peripheral portion insulating layer L formed by a silicon oxide film ($SiO_2$) on an outer peripheral portion of a surface on the gate electrode C side.

A surface of the semiconductor element 1a on the source electrode S side (second main surface) is connected to a lower surface of the upper electrode 1d via the first conductive joining material 1e.

Further, a surface on the drain electrode D side (first main surface) is connected to an upper surface of the lower electrode 1g via the first conductive joining material 1e.

A length of the upper electrode 1d (distance between left and right sides of the upper electrode 1d in FIG. 2) is shorter than a length of the semiconductor element 1a (distance between left and right sides of the semiconductor element 1a in FIG. 2), and both an end portion of the upper electrode 1d and an end portion of a connection portion between the upper electrode 1d and the semiconductor element 1a are inside the semiconductor element 1a. Further, an end portion of the lower electrode 1g connected to the semiconductor element 1a is aligned with the end portion of the upper electrode 1d in a vertical direction.

In manufacturing of the semiconductor device 200 of the present embodiment, in order to form the electronic circuit body 100, first, the first conductive joining materials 1e are disposed between the upper electrode 1d and the semiconductor element 1a and between the semiconductor element 1a and the lower electrode 1g, and are heated to a high temperature to connect the lower surface of the upper electrode 1d to the second main surface of the semiconductor element 1a and connect the upper surface of the lower electrode 1g to the first main surface of the semiconductor element 1a. The connecting process is, for example, reflow or flow. At this time, in order to melt the first conductive joining material 1e, the entire semiconductor device 200 is heated up to a melting point of the joining material or higher, and then cooled to a room temperature.

During the cooling process, thermal strain occurs in all of the upper electrode 1d, the lower electrode 1g, and the semiconductor element 1a. When the upper electrode 1d and the lower electrode 1g are Cu and the semiconductor element 1a is Si, respective thermal expansion coefficients are about $16.8 \times 10^{-6}/K$, $2.4 \times 10^{-6}/K$. Accordingly, the upper electrode 1d and the lower electrode 1g contract more than the semiconductor element 1a. Accordingly, bending deformation occurs in the upper electrode 1d, the lower electrode 1g, and the semiconductor element 1a, and thermal stress is generated in each member.

Figure 5:
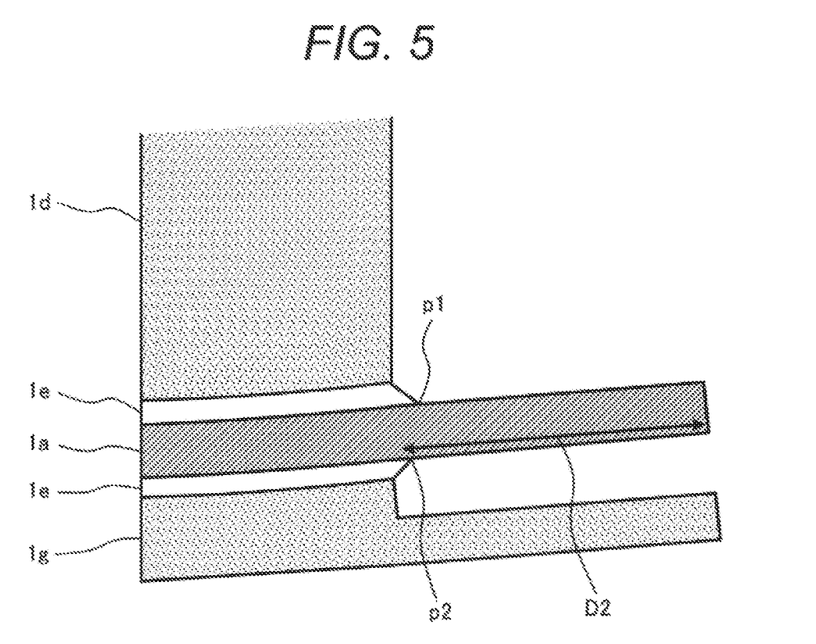
FIG. 5 is a diagram schematically showing deformation in the vicinity of an end portion of the semiconductor element in a connecting process of the semiconductor device according to the first embodiment of the invention.

Next, functions and effects of the semiconductor device of the present embodiment will be described with reference to FIGS. 4 and 5. FIG. 4 is a view showing deformation in the connecting process of a semiconductor device having a structure in the related art, and FIG. 5 is a view showing deformation in the connecting process of the semiconductor device of the present embodiment. In FIGS. 4 and 5, for easy understanding, an end portion of the semiconductor element 1a shown in a region Y of FIG. 2 is enlarged and shown.

As shown in FIG. 4, in the structure in the related art, a length of the lower electrode 1g is larger than that of the semiconductor element 1a. Therefore, a connection portion with the lower electrode 1g extends to an end portion of the first main surface of the semiconductor element 1a. On the other hand, the length of the upper electrode 1d is smaller than that of the semiconductor element 1a. Therefore, regarding the second main surface of the semiconductor element 1a, the connection portion between the upper electrode 1d and the semiconductor element 1a is formed inside the second main surface of the semiconductor element 1a.

Since a length of the connection portion between the lower electrode 1g and the semiconductor element 1a is larger than a length of the connection portion between the upper electrode 1d and the semiconductor element 1a, a force transmitted from the lower electrode 1g to the semiconductor element 1a is larger than a force from the upper electrode 1d, and the bending deformation of the semiconductor element 1a at the time of thermal contraction is convex upward as shown in FIG. 4.

At a point p1 in FIG. 4, the bending deformation of the semiconductor element 1a is large, tensile (bending stress) indicated by an arrow Tb occurs, and tensile (solder thermal stress) indicated by an arrow Tj is further applied from the first conductive joining material 1e at the same time, and accordingly the stress concentrates at the point p1. When a highly rigid joining material such as the lead-free solder or the sintered material is used for the first conductive joining material 1e, the stress at the stress concentration location p1 is further increased, and a risk of cracking of the semiconductor element 1a is further increased as compared with a case of a lead solder.

In contrast, as shown in FIG. 5, in the semiconductor device 200 of the present embodiment, the length of the lower electrode 1g at a portion connected to the semiconductor element 1a via the first conductive joining material 1e is shorter than that of the semiconductor element 1a. Therefore, the first conductive joining material 1e is not connected on a region D2 from the connection end portion with the lower electrode 1g on the first main surface of the semiconductor element 1a to the end portion of the semiconductor element 1a, and bending deformation is smaller than that of the structure in the related art.

Further, both end portions of the lower electrode 1g in a region connected to the semiconductor element 1a are aligned with end portions of the upper electrode 1d in the vertical direction. Accordingly, unbalance in bending deformation on the upper and lower sides is eliminated, stress concentration locations are dispersed at the point p1 and a point p2, and the stress at the stress concentration location p1 is greatly reduced compared to the structure in the related art. Therefore, even when a highly rigid lead-free joining material such as the lead-free solder or the sintered material is used for the first conductive joining material 1e, a highly reliable semiconductor device can be manufactured. Further, the structure of the present embodiment may be applied to a device using the lead solder as the conductive joining material 1e.

Figure 6:
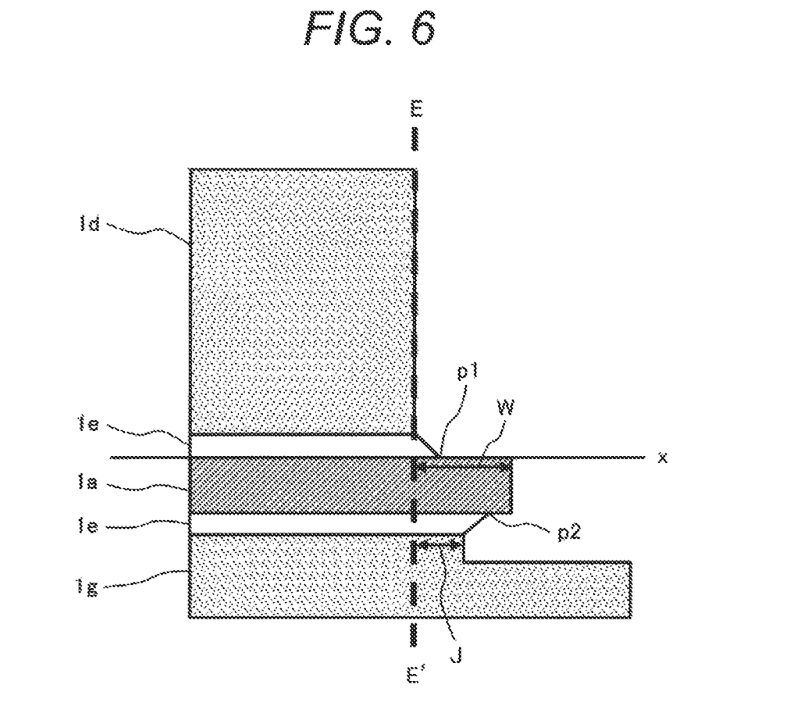
FIG. 6 is a diagram schematically showing a part of the vertical structure of the semiconductor device according to the first embodiment of the invention.
Figure 7:
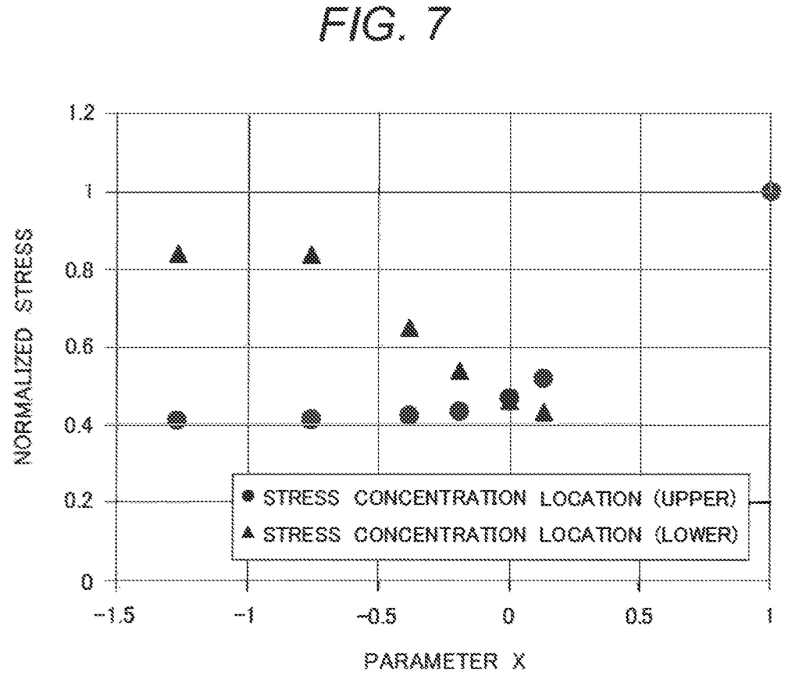
FIG. 7 is a diagram showing thermal stress generated in the semiconductor element in the connecting process of the semiconductor device according to the first embodiment of the invention.

Next, a thermal stress reduction effect in the connecting process of the invention will be quantitatively described with reference to FIGS. 6 and 7. FIG. 6 is a diagram showing definition of a parameter for describing with reference to FIG. 7 how the thermal stress generated in the semiconductor element 1a changes in the connecting process when the length of the lower electrode 1g is changed. FIG. 7 is a result of investigating, by a finite element method, how the thermal stress generated in the semiconductor element 1a changes in the connecting process when the length of the lower electrode 1g is changed. In FIG. 6, for easy understanding, only the end portion of the semiconductor element 1a shown in the region Y of FIG. 2 is enlarged and displayed.

In FIG. 6, a distance from an end portion of a connection surface of the upper electrode 1d to the semiconductor element 1a (dotted line E-E' in FIG. 6) to the end portion of the semiconductor element 1a is set to W. A distance from the end portion of the connection surface of the upper electrode 1d to the semiconductor element 1a to an end portion of a connection surface of the lower electrode 1g to the semiconductor element 1a is set to J. When the end portion of the connection surface of the lower electrode 1g to the semiconductor element 1a is located on a center side relative to the end portion of the connection surface of the upper electrode 1d to the semiconductor element 1a, J is a negative value.

Herein, a parameter normalized by dividing J by W is defined as X. X is a dimensionless value obtained by dividing J by W. In the structure in the related art shown in FIG. 4, X is 1 because the entire lower surface of the semiconductor element 1a is connected to the lower electrode 1g.

In contrast, in the semiconductor device according to the invention shown in FIG. 5, since the length of the lower electrode 1g at a portion connected to the semiconductor element 1a via the first conductive joining material 1e is smaller than that of the semiconductor element 1a, J is smaller than W. Therefore, X is any value less than 1 (however, a lower limit of X is finite). In the semiconductor device 200 of the present embodiment shown in FIG. 2, since the upper electrode 1d and the lower electrode 1g have the same size, J=0 and X=0.

A horizontal axis of FIG. 7 shows the parameter X defined above. A range of the horizontal axis is changed from −1.5 to 1. A vertical axis of FIG. 7 shows thermal stress obtained by normalizing the thermal stress generated in the semiconductor element 1a when the parameter X is changed in the semiconductor device according to the invention by the stress at the stress concentration location p1 of the structure in the related art shown in FIG. 4.

In the structure in the related art of FIG. 4, the normalized stress is 1 corresponding to X=1. The stress at the stress concentration location p1 on the upper electrode 1d side of the semiconductor element 1a shown in FIG. 5 is indicated by a black circle (●) plot, and the stress at the stress concentration location p2 on the lower electrode 1g side of the semiconductor element 1a is indicated by a black triangle (▲) plot. A larger stress generated at the stress concentration location p1 and the stress concentration location p2 is a maximum stress generated in the semiconductor element 1a.

As shown in FIG. 7, the larger the parameter X is, that is, the longer the lower electrode 1g is and the longer the connection length between the lower electrode 1g and the first main surface of the semiconductor element 1a is, the larger the stress at the stress concentration location p1 is. This is because the force transmitted from the lower electrode 1g to the semiconductor element 1a is larger than the force from the upper electrode 1d, and the bending deformation of the semiconductor element 1a at the time of thermal contraction is convex upward as shown in FIG. 4.

On the other hand, the smaller the parameter X is, that is, the shorter the lower electrode 1g is and the shorter the connection length between the lower electrode 1g and the first main surface of the semiconductor element 1a is, the larger the stress at the stress concentration location p2 is. This is because the force transmitted from the upper electrode 1d to the semiconductor element 1a is larger than the force from the lower electrode 1g, and the bending deformation of the semiconductor element 1a at the time of thermal contraction is convex downward.

In this way, since the stress at the stress concentration location p1 and the stress at the stress concentration location p2 have a trade-off relationship, there is a parameter X that minimizes the stress generated in the semiconductor element 1a. It can be seen from FIG. 7 that the stress generated in the semiconductor element 1a is minimum when X=0 (corresponding to the structure of FIG. 2), and is about half that of the structure in the related art (X=1). That is, the end portion of the lower electrode 1g connected to the semiconductor element 1a is preferably aligned with the end portion of the upper electrode 1d in the vertical direction.

In the definition of the parameter X, X=0 can be geometrically implemented by enlarging the upper electrode 1d in the structure in the related art and aligning the end portion of the upper electrode 1d, the end portion of the semiconductor element 1a, and the end portion of the lower electrode 1g in the vertical direction. However, on the second main surface of the semiconductor element 1a, the outer peripheral portion insulating layer L having poor solder wettability is provided in the periphery, the gate electrode C is provided in the vicinity of the outer peripheral portion insulating layer L, and it is necessary to electrically insulate the outer peripheral portion insulating layer L and the gate electrode C from the upper electrode 1d. Therefore, a semiconductor device that operates at X=0 cannot be implemented with the structure in which the entire first main surface of the semiconductor element 1a is connected as in the structure in the related art.

The effect of the invention is not limited to the case of the above-mentioned parameter X=0. For example, in FIG. 6, when W is 0.4 mm and J is 0.2 mm, X=0.5, and it can be seen from FIG. 7 that the stress can be reduced by about 20% as compared with the structure in the related art.

Therefore, even when X=0 cannot be implemented due to a restriction of the configuration of the electronic circuit body 100, according to the invention, it is possible to reduce the stress during the connecting process by bringing X close to 0 in a possible range.

In other words, the semiconductor device 200 of the present embodiment described above includes the semiconductor element 1a including the gate electrode C only on one surface, the upper electrode 1d connected to the surface (second main surface) of the semiconductor element 1a on which the gate electrode C is provided, and the lower electrode 1g connected to the surface (first main surface) of the semiconductor element 1a opposite to the surface on which the gate electrode C is provided. A connection end portion of the upper electrode 1d with the surface (second main surface) of the semiconductor element 1a on which the gate electrode C is provided is located inside an end portion of the surface (second main surface) of the semiconductor element 1a on which the gate electrode C is provided, and a connection end portion of the lower electrode 1g with the opposite surface (first main surface) of the semiconductor element 1a is located inside the end portion of the opposite surface (first main surface) of the semiconductor element 1a.

The upper electrode 1d is connected to the semiconductor element 1a via the first conductive joining material 1e, and the lower electrode 1g is connected to the semiconductor element 1a via the second conductive joining material (1e). The end portion of the connection portion between the first conductive joining material 1e and the upper electrode 1d and the end portion of the connection portion between the second conductive joining material (1e) and the lower electrode 1g are substantially aligned in the vertical direction.

As in a modification shown in FIG. 12, all of the end portion of the connection portion between the first conductive joining material 1e and the upper electrode 1d, the end portion of the connection portion between the second conductive joining material (1e) and the lower electrode 1g, the end portion of the connection portion between the first conductive joining material 1e and the semiconductor element 1a, and the end portion of the connection portion between the second conductive joining material (1e) and semiconductor element 1a may be substantially aligned in the vertical direction.

Second Embodiment

Figure 8:
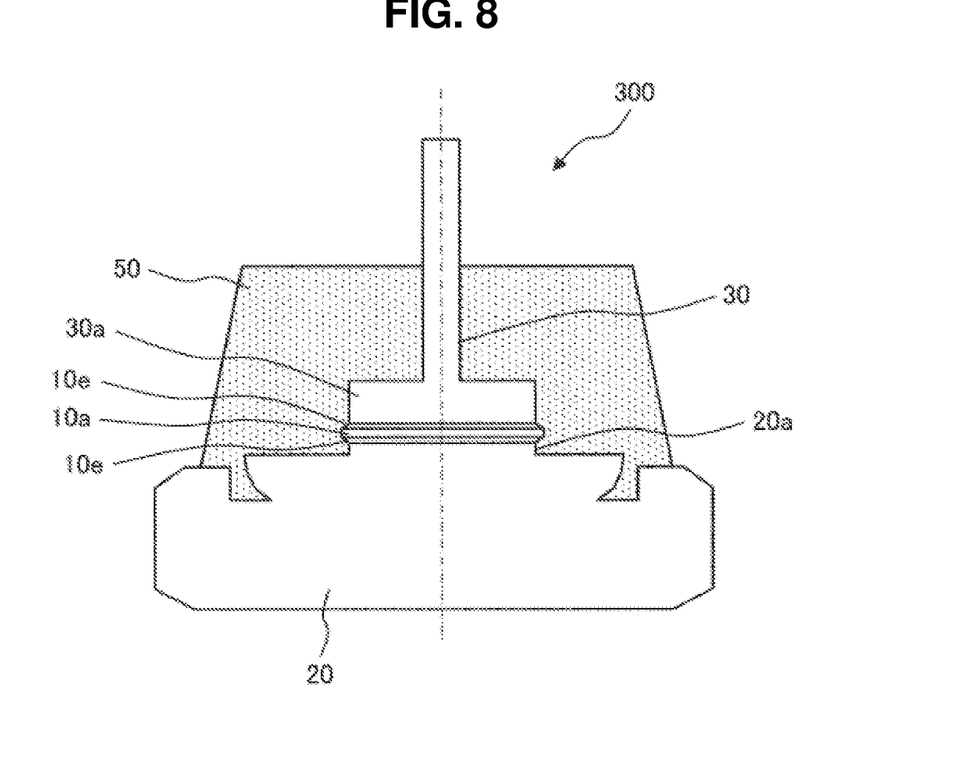
FIG. 8 is a cross-sectional view showing a schematic configuration of a semiconductor device according to a second embodiment of the invention.
Figure 13:
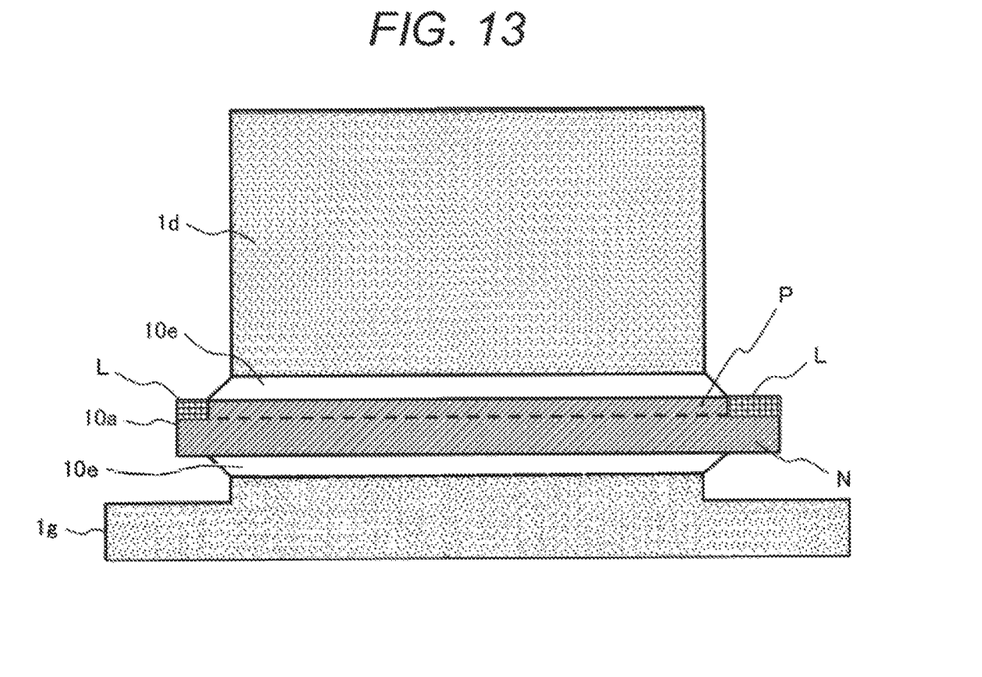
FIG. 13 is a diagram showing a modification of the second embodiment (FIG. 8).

Next, a semiconductor device according to a second embodiment of the invention will be described with reference to FIGS. 8 and 13. FIG. 8 is a diagram schematically showing a cross section of a vertical structure of a semiconductor device (rectifying element) 300 for an on-vehicle AC generator (alternator) of the present embodiment. FIG. 13 is a modification of FIG. 8 and corresponds to FIG. 2 of the first embodiment.

In the first embodiment, a semiconductor element having a switching function such as an MOSFET is used, whereas in the present embodiment, a semiconductor element (diode) having a rectifying function is used.

In FIG. 8, the semiconductor device 300 includes, a base (first external electrode, first external terminal) 20 including a convex pedestal (first electrode surface portion) 20a in an upper portion (upper side of a paper surface of FIG. 8), a lead (second external electrode, second external terminal) 30 including a lead header (second electrode surface portion) 30a in a lower portion (lower side of the paper surface of FIG. 8), and an semiconductor element 10a.

The pedestal 20a is directly connected to the semiconductor element 10a which is a diode via a conductive joining material (joining material of semiconductor device) 10e. The semiconductor element 10a includes the outer peripheral portion insulating layer L on a chip outer peripheral portion only on one surface. The lead header 30a is directly connected to the semiconductor element 10a which is the diode via the conductive joining material 10e.

A length of the lead header 30a (distance between left and right sides of the lead header 30a in FIG. 8) is smaller than a length of the semiconductor element 10a (distance between left and right sides of the semiconductor element 10a in FIG. 8), and both an end portion of the lead header 30a and an end portion of a connection portion between the lead header 30a and the semiconductor element 10a are inside the semiconductor element 10a. Further, an end portion of the pedestal 20a is aligned with the end portion of the lead header 30a in the vertical direction.

A part located on the pedestal 20a and an upper portion of the base 20, a part located on the lead header 30a and a lower portion of the lead 30, and the semiconductor element 10a are covered and sealed with a mold resin (resin of semiconductor device) 50.

In the present embodiment, since the semiconductor element 10a itself which is a diode has a rectifying function, unlike the first embodiment, the semiconductor element 10a can be directly connected to the base (first external electrode) 20 and the lead (second external electrode) 30 without the electronic circuit body 100, so that the semiconductor device can be provided at a lower cost.

Further, since by aligning the end portion of the pedestal 20a with the end portion of the lead header 30a in the vertical direction, a vertical structure similar to that of the first embodiment can be implemented, and thermal stress generated in the semiconductor element 10a in the connecting process can be reduced.

Further, since the AC generator (alternator) requires P-type and N-type rectifying elements, in FIG. 8, it is necessary to manufacture two types of semiconductor devices in which a direction of the semiconductor element 10a is vertically inverted (P pole and N pole are inverted). In the present embodiment, since the end portion of the pedestal 20a is aligned with the end portion of the lead header 30a in the vertical direction, a connection form does not change even if the semiconductor element 10a is inverted. Therefore, a highly reliable semiconductor device can be manufactured for both the P-type and the N-type.

FIG. 13 is a modification of the present embodiment (FIG. 8) in which the semiconductor element 1a of the first embodiment (FIG. 2) is replaced with a diode configured with a P/N junction. Except for the diode, the configuration is similar to that in FIG. 2, and repeated detailed description thereof will be omitted. Similar to the first embodiment (FIG. 2), the semiconductor device 300 may be configured by connecting the upper electrode 1d and the lower electrode 1g to the semiconductor element 10a which is a diode.

That is, in other words, the semiconductor device 300 of the present embodiment described above includes the semiconductor element 10a including the outer peripheral portion insulating layer L on the chip outer peripheral portion only on one surface, the upper electrode 1d connected to the surface of the semiconductor element 10a on which the outer peripheral portion insulating layer L is provided, and the lower electrode 1g connected to the surface of the semiconductor element 10a opposite to the surface on which the outer peripheral portion insulating layer L is provided. The semiconductor element 10a is a diode configured with the P/N junction. A connection end portion of the upper electrode 1d with the surface of the semiconductor element 10a on which the outer peripheral portion insulating layer L is provided is located inside an end portion of the surface of the semiconductor element 10a on which the outer peripheral portion insulating layer L is provided, and a connection end portion of the lower electrode 1g with the opposite surface of the semiconductor element 10a is located inside the end portion of the opposite surface of the semiconductor element 10a.

Third Embodiment

A semiconductor device according to a third embodiment of the invention will be described with reference to FIGS. 9 to 11. A structure of the present embodiment is similar to the semiconductor device 200 of the first embodiment except for a connection form of the semiconductor element 1a and the lower electrode 1g, and therefore repeated description of the overall structure of the semiconductor device is omitted.

Figure 9:
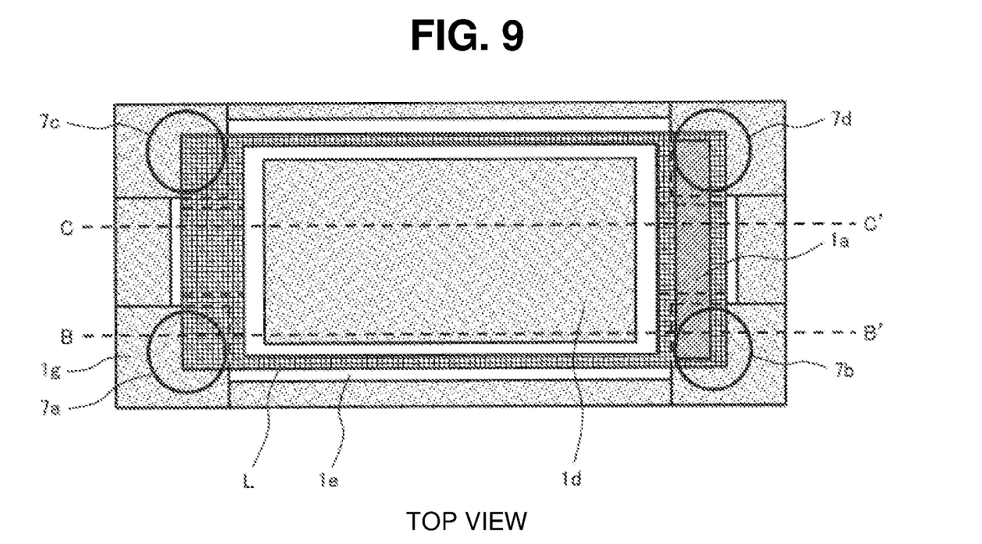
FIG. 9 is a diagram schematically showing a planar structure of a semiconductor device according to a third embodiment of the invention.

FIG. 9 is a diagram schematically showing a planar structure in the vicinity of the semiconductor element 1a in the semiconductor device of the present embodiment. FIGS. 10 and 11 are diagrams schematically showing a vertical structure in the vicinity of the semiconductor element 1a in the semiconductor device of the present embodiment. FIG. 10 corresponds to a cross section taken along a line B-B' of FIG. 9, and FIG. 11 corresponds to a cross section taken along a line C-C' of FIG. 9. In FIGS. 9 to 11, for easy understanding, only the semiconductor element 1a, the upper electrode 1d, the lower electrode 1g, and the first conductive joining material 1e which are disposed in the semiconductor device 200 are shown.

Figure 10:
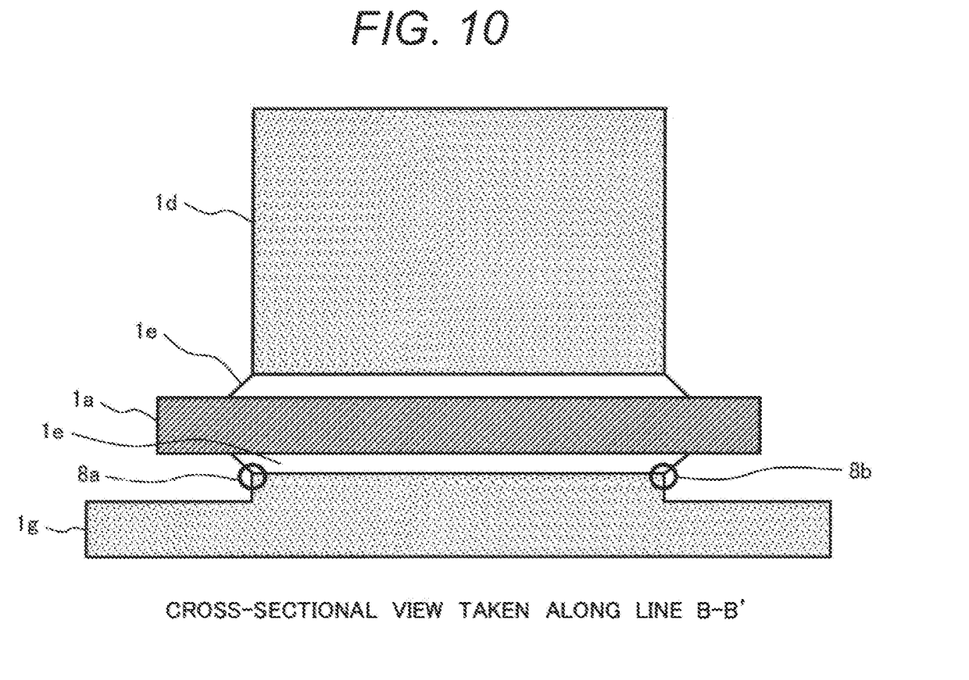
FIG. 10 is a diagram schematically showing a vertical structure of the semiconductor device according to the third embodiment of the invention.

As shown in FIGS. 9 and 10, in the semiconductor device of the present embodiment, in corner regions 7a, 7b, 7c, and 7d of the semiconductor element 1a, end portions 8a, 8b, 8c, and 8d (8c and 8d are not shown) of the lower electrode 1g are inside the semiconductor element 1a and have a structure aligned with end portions of the upper electrode 1d.

Therefore, in the corner regions of the semiconductor element 1a, a vertical structure is similar to that of first embodiment (FIG. 2).

Figure 11:
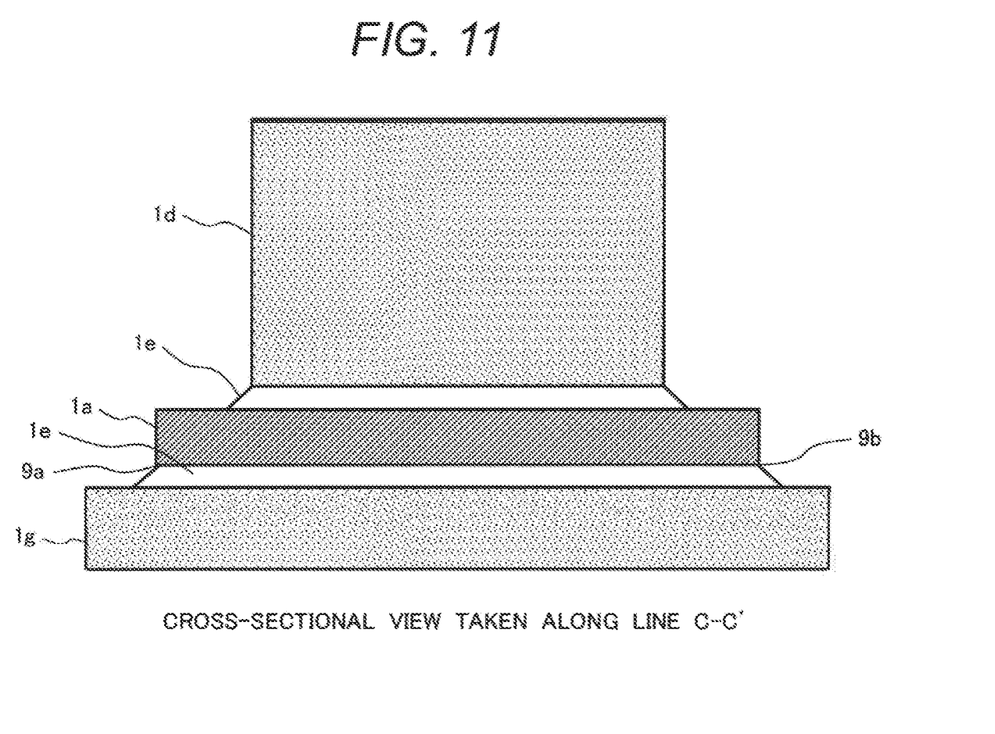
FIG. 11 is a diagram schematically showing a vertical structure of the semiconductor device according to the third embodiment of the invention.

Further, as shown in FIGS. 9 and 11, in the semiconductor device of the present embodiment, since in regions other than the corner regions 7a, 7b, 7c, and 7d of the semiconductor element 1a, a length of the lower electrode 1g at a portion connected to the semiconductor element 1a via the first conductive joining material 1e is larger than that of the semiconductor element 1a, the lower electrode 1g is connected to end portions 9a and 9b of the semiconductor element 1a.

Thermal stress generated in a connecting process becomes particularly high in the corner regions 7a, 7b, 7c, and 7d of the semiconductor element 1a. Therefore, preventing the stress at the corner portions is effective in preventing cracks in the semiconductor element.

Therefore, in the present embodiment, a connection form similar to that of the first embodiment (FIG. 2) is used only in the corner regions of the semiconductor element 1a. In the regions other than the corner regions of the semiconductor element 1a, a contact area between the semiconductor element 1a and the lower electrode 1g is larger than that in the first embodiment (FIG. 2). Accordingly, it is possible to improve heat dissipation while preventing the stress at the corner portions of the semiconductor element.

The invention is not limited to the above-mentioned embodiments, and includes various modifications. For example, the above-mentioned embodiments have been described in detail for easy understanding of the invention, and the invention is not necessarily limited to those including all the configurations described above. In addition, a part of a configuration of one embodiment can be replaced with a configuration of another embodiment, and a configuration of another embodiment can be added to a configuration of one embodiment. Further, a part of the configuration of each embodiment may be added to, deleted from, or replaced with another configuration.

What is claimed is:
1. A semiconductor device comprising:
a semiconductor element including a gate electrode only on one surface;

an upper electrode directly connected, via a first conductive joining material, to the surface of the semiconductor element on which the gate electrode is provided; and a lower electrode directly connected, via a second conductive joining material, to a surface opposite to the surface of the semiconductor element on which the gate electrode is provided, wherein a connection end portion of the upper electrode with the surface of the semiconductor element on which the gate electrode is provided is located inside an end portion of the surface of the semiconductor element on which the gate electrode is provided, and a connection end portion of the lower electrode with the opposite surface of the semiconductor element is located inside an end portion of the opposite surface of the semiconductor element; and the first conductive joining material is wider at a surface contacting the semiconductor element than a surface contacting the upper electrode, and the second conductive joining material is wider at a surface contacting the semiconductor element than a surface contacting the lower electrode.

2. The semiconductor device according to claim 1, wherein in at least one corner portion of the semiconductor element, the connection end portion of the lower electrode with the opposite surface of the semiconductor element is located inside the end portion of the opposite surface of the semiconductor element.

3. The semiconductor device according to claim 2, wherein except for the corner portion of the semiconductor element, the connection end portion of the lower electrode with the opposite surface of the semiconductor element is located outside the end portion of the opposite surface of the semiconductor element.

4. The semiconductor device according to claim 1, wherein an end portion of a connection portion between the first conductive joining material and the upper electrode, an end portion of a connection portion between the second conductive joining material and the lower electrode, an end portion of a connection portion between the first conductive joining material and the semiconductor element, and an end portion of a connection portion between the second conductive joining material and the semiconductor element are located inside an end portion of the semiconductor element.

5. The semiconductor device according to claim 4, wherein the end portion of the connection portion between the first conductive joining material and the upper electrode and the end portion of the connection portion between the second conductive joining material and the lower electrode are substantially aligned in a vertical direction.

6. The semiconductor device according to claim 5, wherein the end portion of the connection portion between the first conductive joining material and the upper electrode, the end portion of the connection portion between the second conductive joining material and the lower electrode, the end portion of the connection portion between the first conductive joining material and the semiconductor element, and the end portion of the connection portion between the second conductive joining material and the semiconductor element are substantially aligned in the vertical direction.

7. The semiconductor device according to claim 4, wherein the first conductive joining material and the second conductive joining material are any one of a lead-free solder, a sintered material, and a conductive adhesive material.

8. A semiconductor device comprising:

a semiconductor element including an outer peripheral portion insulating layer on a chip outer peripheral portion only on one surface;

an upper electrode directly connected, via a first conductive joining material, to the surface of the semiconductor element on which the outer peripheral portion insulating layer is provided; and a lower electrode directly connected, via a second conductive joining material, to a surface opposite to the surface of the semiconductor element on which the outer peripheral portion insulating layer is provided, wherein the semiconductor element is a diode, and a connection end portion of the upper electrode with the surface of the semiconductor element on which the outer peripheral portion insulating layer is provided is located inside an end portion of the surface of the semiconductor element on which the outer peripheral portion insulating layer is provided, and a connection end portion of the lower electrode with the opposite surface of the semiconductor element is located inside an end portion of the opposite surface of the semiconductor element; and the first conductive joining material is wider at a surface contacting the semiconductor element than a surface contacting the upper electrode, and the second conductive joining material is wider at a surface contacting the semiconductor element than a surface contacting the lower electrode.

9. The semiconductor device according to claim 8, wherein in at least one corner portion of the semiconductor element, the connection end portion of the lower electrode with the opposite surface of the semiconductor element is located inside the end portion of the opposite surface of the semiconductor element.

10. The semiconductor device according to claim 9, wherein except for the corner portion of the semiconductor element, the connection end portion of the lower electrode with the opposite surface of the semiconductor element is located outside the end portion of the opposite surface of the semiconductor element.

11. The semiconductor device according to claim 8, wherein an end portion of a connection portion between the first conductive joining material and the upper electrode, an end portion of a connection portion between the second conductive joining material and the lower electrode, an end portion of a connection portion between the first conductive joining material and the semiconductor element, and an end portion of a connection portion between the second conductive joining material and the semiconductor element are located inside an end portion of the semiconductor element.

12. The semiconductor device according to claim 11, wherein the end portion of the connection portion between the first conductive joining material and the upper electrode and the end portion of the connection portion between the second conductive joining material and the lower electrode are substantially aligned in a vertical direction.

13. The semiconductor device according to claim 12, wherein the end portion of the connection portion between the first conductive joining material and the upper electrode, the end portion of the connection portion between the second conductive joining material and the lower electrode, the end portion of the connection portion between the first conductive joining material and the semiconductor element, and the end portion of the connection portion between the second conductive joining material and the semiconductor element are substantially aligned in the vertical direction.

14. The semiconductor device according to claim 11, wherein the first conductive joining material and the second conductive joining material are any one of a lead-free solder, a sintered material, and a conductive adhesive material.

* * * * *